(12) United States Patent
Marks et al.

(10) Patent No.: US 6,399,514 B1
(45) Date of Patent: *Jun. 4, 2002

(54) HIGH TEMPERATURE SILICON SURFACE PROVIDING HIGH SELECTIVITY IN AN OXIDE ETCH PROCESS

(75) Inventors: Jeffrey Marks, San Jose; Jerry Yuen-Kui Wong, Fremont; David W. Groechel, Sunnyvale; Peter R. Keswick, Newark; Chan-Lon Yang, Los Gatos, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/645,924

(22) Filed: Aug. 24, 2000

Related U.S. Application Data

(60) Division of application No. 07/826,310, filed on Jan. 24, 1992, now Pat. No. 6,171,974, which is a continuation-in-part of application No. 07/722,340, filed on Jun. 27, 1991, now abandoned.

(51) Int. Cl.$^7$ .................................. H01L 21/302
(52) U.S. Cl. .................. 438/729; 438/711; 438/714; 438/719; 438/723; 216/71; 216/79; 216/80
(58) Field of Search ................... 438/723, 714, 438/711, 719, 729; 216/71, 79, 80

(56) References Cited

U.S. PATENT DOCUMENTS

| | | | |
|---|---|---|---|
| 4,427,516 A | 1/1984 | Levinstein et al. | 204/192 E |
| 4,786,359 A | 11/1988 | Stark et al. | 156/643 |
| 4,807,016 A | 2/1989 | Douglas | 357/67 |
| 4,855,017 A | 8/1989 | Douglas | 156/643 |

(List continued on next page.)

FOREIGN PATENT DOCUMENTS

| | | |
|---|---|---|
| EP | 0 644 584 A1 | 3/1995 |
| JP | 55-154581 | 12/1980 |
| JP | 59-46094 | 11/1984 |
| JP | 62-7268 | 2/1987 |
| JP | 63-9120 | 1/1988 |
| JP | 64-15928 | 1/1989 |
| JP | 3-12922 A | 1/1991 |

OTHER PUBLICATIONS

Bariya et al., "A surface kinetic model for plasma polymerization with application to plasma etching," *J. Electrochem Soc.*, vol. 137, No. 8, Aug. 1980, pp. 2575–2581.

Butterbaugh et al., Plasma–surface interactions in fluorocarbon etching of silicon dioxide, *J. Vac. Sci. Technol. B*, vol. 9, No. 3, May/Jun. 1991, pp. 1461–1470.

J. W. Coburn, "Increasing the etch rate ratio of $SiO_2/Si$ in fluorocarbon plasma etching," *IBM Technical Disclosure Bulletin*, vol. 19, No. 10, Mar. 1977.

(List continued on next page.)

Primary Examiner—George Goudreau
(74) Attorney, Agent, or Firm—Charles Guenzer; Joseph Bach

(57) ABSTRACT

A plasma process for etching oxide and having a high selectivity to silicon including flowing into a plasma reaction chamber a fluorine-containing etching gas and maintaining a temperature of an exposed silicon surface within said chamber at a temperature of between 200° C. and 300° C. An example of the etching gas includes $SiF_4$ and a fluorocarbon gas. The plasma may be generated by a capacitive discharge type plasma generator or by an electromagnetically coupled plasma generator, such as an inductively coupled plasma generator. The high selectivity exhibited by the etch process permits use of an electromagnetically coupled plasma generator, which in turn permits the etch process to be performed at low pressures of between 1 and 30 milliTorr, resulting the etching of vertical sidewalls in the oxide layer.

23 Claims, 1 Drawing Sheet

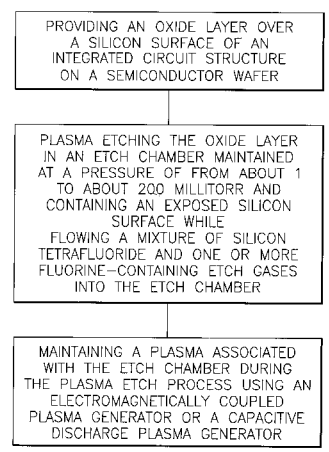

U.S. PATENT DOCUMENTS

| | | | |
|---|---|---|---|
| 5,006,220 A | | 4/1991 | Hijikata et al. ......... 204/298.33 |
| 5,074,456 A | | 12/1991 | Degner et al. ............... 228/121 |
| 5,078,833 A | | 1/1992 | Kadomura ................... 156/643 |
| 5,266,154 A | | 11/1993 | Tatsumi ....................... 156/643 |
| 5,770,099 A | * | 6/1998 | Rice et al. ..................... 216/68 |
| 5,772,832 A | | 6/1998 | Collins et al. ............... 156/345 |
| 5,965,463 A | * | 10/1999 | Cui et al. .................... 438/723 |
| 5,990,017 A | * | 11/1999 | Collins et al. ............... 438/714 |
| 6,063,877 A | * | 3/2000 | Collins et al. ................. 216/68 |
| 6,083,412 A | * | 7/2000 | Rice et al. ..................... 216/67 |
| 6,171,974 B1 | * | 1/2001 | Marks et al. ............... 438/740 |
| 6,194,325 B1 | * | 2/2001 | Yang et al. ................. 438/740 |

OTHER PUBLICATIONS

Maurer et al., "Selective etching of oxide in a $CF_4/H_2$ plasma," Abstract No. 277, *IBM General Technical Division*, Hopewell Junction, N.Y., pp. 674–677.

Oehrlein et al., "Reactive ion etching related Si surface residues and subsurface damage: Their relationship to fundamental etching mechanisms," *J. Vac. Sci. Technol.* A 5 (4), Jul./Aug. 1997, pp. 1585–1595.

J.A. Bondur et al., "Gas mixing to prevent polymer formation during reactive ion etching," *IBM Technical Disclosure Bulletin*, vol. 21, No. 10, Mar. 1979, p. 4016.

* cited by examiner

```
┌─────────────────────────────────────────┐
│   PROVIDING AN OXIDE LAYER OVER         │
│     A SILICON SURFACE OF AN             │
│  INTEGRATED CIRCUIT STRUCTURE           │
│    ON A SEMICONDUCTOR WAFER             │
└─────────────────────────────────────────┘
                    │
┌─────────────────────────────────────────┐
│  PLASMA ETCHING THE OXIDE LAYER         │
│   IN AN ETCH CHAMBER MAINTAINED         │
│   AT A PRESSURE OF FROM ABOUT 1         │
│     TO ABOUT 200 MILLITORR AND          │
│    CONTAINING AN EXPOSED SILICON        │
│           SURFACE WHILE                 │
│   FLOWING A MIXTURE OF SILICON          │
│  TETRAFLUORIDE AND ONE OR MORE          │
│  FLUORINE-CONTAINING ETCH GASES         │
│        INTO THE ETCH CHAMBER            │
└─────────────────────────────────────────┘
                    │
┌─────────────────────────────────────────┐
│   MAINTAINING A PLASMA ASSOCIATED       │
│    WITH THE ETCH CHAMBER DURING         │
│  THE PLASMA ETCH PROCESS USING AN       │
│     ELECTROMAGNETICALLY COUPLED         │
│  PLASMA GENERATOR OR A CAPACITIVE       │
│     DISCHARGE PLASMA GENERATOR          │
└─────────────────────────────────────────┘
```

HIGH TEMPERATURE SILICON SURFACE PROVIDING HIGH SELECTIVITY IN AN OXIDE ETCH PROCESS

RELATED APPLICATION

This application is a division of Ser. No. 07/826,310, filed Jan. 24, 1992, now issued U.S. Pat. No. 6,171,974 which is a continuation-in-part of Ser. No. 07/772,340 filed Jun. 27, 1991, abandoned.

FIELD OF THE INVENTION

This invention relates to a process for plasma etching oxide with high selectivity to nonoxide silicon-containing layers in an integrated circuit structure in either a capacitive discharge or electromagnetically coupled type of plasma reactor.

BACKGROUND ART

Oxide layers typically are utilized as insulation, overlying silicon or silicon-containing surfaces, e.g., single crystal silicon such as a silicon wafer, epitaxial silicon, polysilicon, or silicides such as titanium silicide in integrated circuit structures. Such as oxide layers may be selectively etched, for example, to form vias for formation of conductive contacts to the underlying silicon. Coventionally such oxide etches are carried out in a plasma etch process utilizing one or more fluorine-containing etch gases such as, for example, $CF_4$, $CHF_3$, $CH_2F_2$, $CH_3F$, $C_2F_6$, $NF_3$, $SF_6$, etc.

When conventional capacitive discharge plasma generators are utilized in such prior art oxide etching processes, the pressure in the etch chamber is typically maintained at about 100 to 1000 milli-Torr (1 Torr), resulting in a selectivity, with respect to silicon, of about 20:1. That is, oxide is preferentially etched instead of silicon by a ratio of about 20:1.

However, the use of such a high pressure during the etch adversely affects control of the etch profile. For example, to achieve vertical walls in 0.35 micrometer ($\mu$m) diameter contacts and/or vias, lower pressures of below 200 milliTorr, preferably below 30 milliTorr, and typically about 10 milliTorr, must be used. However, at such low pressures, the use of a conventional parallel plate capacitive discharge type plasma generator may result in a low etch rate and higher peak-to-peak voltage, necessitating the use of another type of plasma generator such as an electromagnetically coupled type plasma generator.

While the use of a pressure of about 10 millliTorr and a plasma generated by an electromagnetically coupled plasma generator does result in the etching of contact holes with vertical walls, the selectivity to silicon of such an etch system, using the previously discussed fluorine-containing etch gas chemistry, is reduced to about 6:1, probably due to the difficultly of polymer formation in such a low pressure environment and the more aggressive nature of the higher density plasma which results from the use of such an electromagnetically coupled plasma generator instead of the capacitive discharge type plasma generator.

Such a low selectivity may by satisfactory for a highly planarized structure and for perfectly uniform etch/plasma chamber conditions. However, such a low selectivity is unacceptable in many applications where it is highly desirable to etch as little silicon as possible once such silicon is exposed during the etching of the overlying oxide. For example, it is desirable in some instances, to etch less than about 5 nm ($5 \times 10^{-3}$ $\mu$m) of underlying silicon during the oxide etch.

Such conventional plasma oxide etch processes, using one or more conventional fluorine-containing etch gases, usually rely on the formation of a polymer to inhibit etching of the silicon, wherein liberation of oxygen, during etching of the oxide, breaks down the polymer on the oxide surface, while the absence of such generated oxygen prevents breakdown of the polymer over silicon surfaces. It is, therefore, necessary to increase such polymer generation to achieve a higher selectively than the above mentioned 6:1 oxide to silicon etch ratio for electromagnetically coupled type plasmas.

However, such an increase in polymer formation increases the selectivity of the process at the expense of a reduction of the oxide etch rate, a reduction of the process window, and an increase in the chances for particle formation. This, in turn, can result in an unacceptable reduction in through-put of the process and a reduction of device yield.

It would, therefore, be desirable to provide an oxide etch process which would exhibit high selectivity to silicon, even when used at low pressure, e.g., about 10 milliTorr, with an electromagnetically coupled plasma generator, without any substantial reduction in etch rate of the oxide material.

SUMMARY OF THE INVENTION

The oxide etch process of the invention comprises the plasma etching of oxide over a silicon-containing surface using a mixture of $SiF_4$ gas and one or more fluorine-containing etchant gases to provide a process having high selectivity with respect to the silicon-containing surface. Preferably the etch chamber in which the process is carried out also contains an exposed silicon surface.

In a preferred embodiment, the etch process of the invention is carried out at a pressure of from about 1 to about 30 milliTorr, typically about 10 milliTorr, using a plasma generated by an electromagnetically coupled plasma generator. The etch process may, however, be used at higher pressures of from about 50 to about 200 milliTorr, typically about 100 milliTorr, using a plasma which may be generated by either the above-mentioned electromagnetically coupled plasma generator or by a capacitive discharge (parallel plate) type plasma generator.

The oxide etch process of the invention exhibits high selectivity to silicon of as much as 30:1, i.e., oxide is etched at a rate as much as 30 times the etch rate of silicon, regardless of the type of plasma generator utilized, or the pressure utilized within the broad range of from about 1 to about 200 milliTorr.

BRIEF DESCRIPTION OF THE DRAWING

The sole drawing is a flowsheet illustrating a process of the invention.

DETAILED DESCRIPTION OF THE PREFERRED EMBODIMENTS

The oxide etch process of the invention comprises a highly selective plasma etch for the plasma etching of oxide over a non-oxide silicon-containing surface on an integrated circuit structure in an etch chamber using a mixture of $SiF_4$ gas and one or more fluorine-containing etchant gases. Preferably the etch chamber also contains an exposed silicon surface.

The one or more fluorine-containing etchant gases used in the process of the invention in combination with $SiF_4$ will, of course, be understood to mean a fluorine-containing etchant gas (or gases) other than $SiF_4$. Such fluorine-containing etchant gases may comprise one or more 1–2 carbon fluorine-containing hydrocarbon gases such as, for example, $CF_4$, $CHF_3$, $CH_2F_2$, $CH_3F$, $C_2F_6$, and mixtures of the same. Other fluorine-containing etchant gases such as $NF_3$, $SF_6$, and mixtures of same may also be used, as well as mixtures of such fluorine-containing etchant gases with 1–2 carbon fluorine-containing hydrocarbon etching gases.

The one or more fluorine-containing etchant gases used in combination with $SiF_4$ in the practice of the process of the invention may also comprise one or more higher molecular weight fluorinated hydrocarbons. Higher weight fluorinated hydrocarbons are defined as 3–6 carbon fluorinated hydrocarbon compounds having the general formula $C_xH_yF_z$, wherein x is 3 to 6, y is 0 to 3, and z is 2x–y (for cyclic compounds) or 2x–y+2 (for non-cyclic compounds). Such 3–6 carbon fluorinated hydrocarbons comprise an organic molecule: containing either carbon and fluorine (hydrogen-free fluorocarbon); or carbon, fluorine, and hydrogen (hydrofluorocarbon); and which may be either cyclic or non-cyclic, but not aromatic.

Examples of cyclic 3–6 carbon fluorinated hydrocarbon compounds which may be included in the above formula are: $C_3H_3F_3$, $C_3H_2F_4$, $C_3HF_5$, $C_3F_6$, $C_4H_3F_5$, $C_4H_2F_6$, $C_4HF_7$, $C_4F_8$, $C_5H_3F_7$, $C_5H_2F_8$, $C_5HF_9$, $C_5F_{10}$, $C_6H_3F_9$, $C_6H_2F_{10}$, $C_4HF_{11}$, and $C_6F_{12}$. Examples of non-cyclic 3–6 carbon fluorinated hydrocarbons compounds which may be included in the above formula are: $C_3H_3F_5$, $C_3H_2F_6$, $C_3HF_7$, $C_3F_8$, $C_4H_3F_7$, $C_4H_2F_8$, $C_4HF_9$, $C_4F_{10}$, $C_5H_3F_9$, $C_5H_2F_{10}$, $C_5HF_{11}$, $C_5F_{12}$, $C_6H_3F_{11}$, $C_6H_2F_{12}$, $C_4HF_{13}$, and $C_6F_{14}$. Preferred among the above 3–6 carbon fluorinated hydrocarbon compounds is cyclooctofluorobutane ($C_4F_8$).

Any of these higher weight fluorinated hydrocarbon etchant gases may be used alone or in combination with any of the other previously discussed fluorine-containing etchant gases, together with $SiF_4$.

The amount of $SiF_4$ gas used in the etch chamber should range from about 10 to about 50 volume percent of the total amount of fluorine-containing etchant gas (or gases) used. Thus, for example, when one or more fluorine-containing etchant gases are flowed into a 9 liter etch chamber at a flow rate from about 20 standard cubic centimeters per minute (sccm) to about 60 sccm, the flow rate of $SiF_4$ will range from about 2 sccm (10 volume % of 20 sccm) to about 30 sccm (50 volume % of 60 sccm). When a larger or smaller etch chamber is used, the flow rates may need to be respectively adjusted either upwardly or downwardly, but the ratio of $SiF_4$ gas to the total of the one or more fluorine-containing etchant gases used in the process will remain the same.

The mixture of $SiF_4$ and one or more fluorine-containing etch gases may be used alone in the etch chamber or may be further diluted using one or more inert gases such as helium or argon. Such inert gases may be flowed into the etch chamber at a rate of 0 to about 200 sccm. In some instances, nitrogen or other non-reactive gas or gases may also be used with the mixture of $SiF_4$ and one or more fluorine-containing etch gases (with or without inert gases).

The plasma etch process of the invention using a combination of $SiF_4$ and one or more fluorine-containing etch gases (with or without other gases) maybe used in combination with a conventional capacitive discharge (parallel plate) plasma generator or with an electromagnetically coupled plasma generator. The plasma associated with the etch chamber during the etch process of the invention may comprise a plasma generated within the etch chamber or generated external to the etch chamber itself, but in the etch gas flow upstream of the chamber.

Furthermore, as more fully described in U.S. Pat. No. 5,556,501, the parent of which was filed on Jun. 27, 1991 by us and others, assigned to the assignee of this invention, and cross-reference to which is hereby made, an electrode, having a silicon-containing surface, may also be provided in the etch chamber. This silicon-containing electrode may be optionally maintained at the rf bias. The presence of this silicon-containing electrode in the etch chamber during the etch has been found to be beneficial with or without an RF bias on the electrode. However, if an RF bias is not applied to the electrode, it is beneficial to maintain the silicon-containing surface of the electrode at an elevated temperature of from about 200° C. to about 300° C. to inhibit polymer deposition on the surface.

While we do not wish to be bound by any theories of operation, it is believed that the presence of the silicon-containing electrode in the etch chamber during the etch process inhibits the presence of excess amounts of free fluorine radicals in the chamber, i.e., acts as a buffer.

The pressure used during the etch process of the invention may vary from as little as 1 milliTorr to as high as 200 milliTorr. It will be noted, however, that it may not be possible to use a pressure below about 50 milliTorr when using a capacitive plate type plasma generator because of the inability of such a plasma generator to ignite or sustain a plasma in a pressure below about 50 milliTorr.

Therefore, preferably the pressure is maintained within a range of from about 50 milliTorr to about 200 milliTorr when using a capacitive discharge type plasma generator in the process of the invention. However, since it is highly desirable to operate the process of the invention below a pressure of about 50 milliTorr, for example, to achieve vertical wall openings in the oxide layer such as vias, as previously discussed, preferably the process the invention is practiced utilizing a plasma generator which is capable of operating in the broader pressure range of from about 1 milliTorr to about 200 milliTorr, and most preferably in the pressure range of from about 1 milliTorr to about 30 milliTorr. An electromagnetically coupled plasma generator is, therefore, advantageously used in the practice of the process of the invention.

The term "electromagnetically coupled plasma generator" is intended to define any type of plasma generator which uses an electromagnetic field, rather than a capacitively coupled generator, to generate a plasma. Such electromagnetically coupled plasma generators can generate a plasma having an ion density of greater than about $10^{10}$ ions per cubic centimeter which is characterized herein as a "high density" plasma, which is the preferred plasma density for use in the process of the invention.

Included within the term "electromagnetcially coupled plasma generator," for example, is an electron cyclotron resonance (ECR) type plasma generator such as described in Matsuo et al. U.S. Pat. No. 4,401,054; Matsuo et al. U.S. Pat. No. 4,492,620; and Ghanbari U.S. Pat. No. 4,778,561 (cross-reference to which three patents is hereby made); as well as in an article by Machida et al. entitled "$SiO_2$ Planarization Technology With Biasing and Electron Cyclotron Resonance Plasma Deposition for Submicron Interconnections," published in the Journal of Vacuum Science Technology B, Vol. 4, No. 4, July/August 1986, at pp. 818–821.

Also included in the term "electromagnetically coupled plasma generator" for example, is an inductively coupled helical or cylindrical resonator such as described in Steinberg et al. U.S. Pat. No. 4,368,092 or Flamm et al. U.S. Pat. No. 4,918,031, cross reference to both of which patents is hereby made.

Further included in the term "electromagnetically coupled plasma generator" for example, is a helicon diffusion resonator such as the plasma generator described in Boswell U.S. Pat. No. 4,810,935, cross-reference to which is also made.

Ogle U.S. Pat. No. 4,948,458, cross-reference to which is also hereby made, describes yet a further type of electromagnetically coupled plasma generator comprising a transformer coupled plasma generator.

The power level of the plasma may vary from about 500 watts to about 5 kilowatts (kW), depending upon the particular type of plasma generator, size of chamber, desired etch rate, etc. For example, using an ECR type electromagnetically coupled plasma generator in association with a etch chamber of about 6 liters and a desired etch rate of about 500 nm per minute, the power would typically range from about 2 to about 3 kW. For an inductive type electromagnetically coupled plasma generator used in association with a 2 liter etch chamber and a desired etch rate of about 500 nm per minute, the power would typically range from about 1 to about 2 kW. When a high density plasma is to be generated, the power density, i.e., the power level relative to the volume of the plasma generating chamber, should be equivalent to a power level of about 1000 watts in a 4 liter plasma generating chamber.

A further advantage of the process of the invention is that the high selectivity to silicon exhibited by the use of silicon tetrafluoride ($SiF_4$) permits the use of a "leaner" fluorine-containing etch gas or gases in combination with the $SiF_4$ gas which will generate less polymer and thus permit a faster etch rate. By a "leaner" fluorine-containing etch gas which will generate less polymer is meant a fluorine-containing etch gas which does not contain any carbon, such as $NF_3$ or $SF_6$; or carbon and fluorine-containing gas having a fluorine to carbon ratio (F/C) of at least 3:1, e.g., such as $CHF_3$, and preferably at least 4:1, e.g., $CF_4$.

To further illustrate the practice of the invention, a 6 inch diameter silicon wafer, having a layer of oxide thereon, and a patterned photoresist mask formed over the oxide layer, was placed in a 9 liter plasma etching chamber maintained at a pressure of about 10 milliTorr. A mixture of about 12 sccm of $SiF_4$ and 30 sccm of $CF_4$ was flowed through the chamber while a plasma was ignited and maintained at a power level of about 2500 watts, using an electromagnetically coupled plasma generator.

The oxide etch was carried out for about 60 seconds, after which the plasma was extinguished, the flow of gases shut off, and the etched wafer removed from the etch chamber. The etched oxide layer was examined, using SEM, and contact holes, having an average diameter of about 0.35 microns and vertical walls, with respect to the surface of the oxide layer, were found to have been formed in the oxide layer.

Thus, the process of the invention provides an improved plasma etch process for oxide wherein the use of a combination of silicon tetrafluoride and one or more fluorine-containing etch gases provides an etch system having a high selectivity for silicon. This high selectivity permits the optional use of leaner fluorine-containing etch gases, e.g., gases having low carbon to fluorine ratio, which will generate less polymer and thus provide a faster etch rate. The use of this mixture of etch gases also permits use of either capacitive discharge or electromagnetically coupled type plasma generators in the process. The process may be carried out at pressures ranging from about 1 to about 200 milliTorr. The process may be carried out using an electromagnetically coupled plasma generator, preferably at a low pressure, ranging from about 1 to about 30 milliTorr, typically about 10 milliTorr; or may be carried out using a capacitive discharge type plasma generator, preferably at a higher pressure of from about 50 to 25 about 200 milliTorr, typically about 100 milliTorr. Use of an electromagnetically coupled plasma generator permits the process to be used at a low pressure of from about 1 to 30 milliTorr which, in turn, permits formation of vertical sidewall openings in the oxide layer being etched.

What is claimed is:

1. A plasma etch process for a plasma processing chamber provided with an interior non-oxide silicon-containing surface and adapted to accept a substrate for processing, the process comprising:

flowing a fluorine-containing etching gas into the chamber;

forming a plasma from the etching gas to etch the substrate; and maintaining the non-oxide silicon-containing surface at a temperature of at least 200° C.

2. The process of claim 1, wherein temperature is no more than 300° C.

3. The process of claim 1, wherein said non-oxide silicon-containing surface is a silicon surface.

4. The process of claim 1, wherein said plasma processing chamber is an electromagnetically coupled plasma reactor.

5. The process of claim 4, wherein said electromagnetically coupled plasma reactor is inductively coupled.

6. The process of claim 1, wherein said plasma processing chamber is a capacitive discharge plasma generator.

7. The process of claim 1, wherein said plasma is formed by coupling power into said chamber using electron cyclotron resonance.

8. The process of claim 1, wherein said plasma is formed by coupling power into said chamber through a helical resonator.

9. The process of claim 1, wherein said fluorine-containing etching gas is a carbon-containing etching gas.

10. The process of claim 9, wherein said etching gas contains a gas consisting of fluorine and carbon atoms.

11. The process of claim 1, wherein said non-oxide silicon-containing surface is incorporated into an electrode.

12. The process of claim 11, further comprising applying RF power to said electrode.

13. The process of claim 1, further comprising maintaining an RF bias on said silicon-containing surface.

14. The process of claim 1, wherein said flowing step flows a silicon-containing gas into said chamber.

15. A plasma etch process comprising:

a) flowing a fluorine-containing etching gas into a plasma etching chamber, said chamber adapted to receive and support a substrate to be etched and further comprising a separate and exposed silicon-containing surface within said chamber;

b) forming a plasma from said etching gas including inductively coupling power into said chamber so as to etch said substrate positioned in said chamber; and c) maintaining said separate silicon-containing surface at a temperature of at least 200° C., thereby inhibiting free fluorine radicals in said chamber.

16. The process of claim 15, wherein said temperature is no more than 300° C.

17. The process of claim 15, wherein said silicon-containing surface is a silicon surface.

18. The process of claim 15, wherein said forming step uses a helical resonator to couple said power into said chamber.

19. The process of claim 15, wherein said fluorine-containing etching gas contains a fluorocarbon gas consisting of carbon and fluorine atoms.

20. The process of claim 19, wherein said fluorocarbon gas consists of $C_xF_z$, where x is 3 to 6.

21. The process of claim 15, wherein said fluorine-containing etching gas does contain an effective amount of elemental hydrogen.

22. The process of claim 10, wherein said fluorocarbon gas consists of $C_xF_z$, where x is 3 to 6.

23. A plasma etch process for a plasma processing chamber provided with an interior non-oxide silicon-containing surface and adapted to accept a substrate for processing, the process comprising:

flowing a fluorine-containing etching gas into the chamber;

etching the substrate with a plasma formed from the etching gas; and maintaining the non-oxide silicon-containing surface at a temperature of at least 200° C.

* * * * *